(12) United States Patent
Van Noort et al.

(10) Patent No.: US 7,838,374 B2
(45) Date of Patent: Nov. 23, 2010

(54) METHOD OF MANUFACTURING A BIPOLAR TRANSISTOR

(75) Inventors: Wibo D. Van Noort, Wappingers Falls, NY (US); Jan Zonsky, Leuven (BE); Andreas M. Piontek, Leuven (BE)

(73) Assignee: NXP B.V., Eindhoven (NL)

( * ) Notice: Subject to any disclaimer, the term of this patent is extended or adjusted under 35 U.S.C. 154(b) by 145 days.

(21) Appl. No.: 12/282,300

(22) PCT Filed: Mar. 9, 2007

(86) PCT No.: PCT/IB2007/050786
§ 371 (c)(1),
(2), (4) Date: Sep. 9, 2008

(87) PCT Pub. No.: WO2007/105155
PCT Pub. Date: Sep. 20, 2007

(65) Prior Publication Data
US 2009/0053872 A1 Feb. 26, 2009

(30) Foreign Application Priority Data
Mar. 10, 2006 (EP) .................................. 06110950
Mar. 9, 2007 (WO) ................. PCT/IB2007/050786

(51) Int. Cl.
*H01L 21/331* (2006.01)
(52) U.S. Cl. ................. 438/318; 438/357; 257/E21.608
(58) Field of Classification Search ................. 438/318, 438/357; 257/E21.608
See application file for complete search history.

(56) References Cited

U.S. PATENT DOCUMENTS

| 5,439,832 | A | 8/1995 | Nakamura |
| 5,620,907 | A | 4/1997 | Jalali-Farahani et al. |
| 6,395,608 | B2 * | 5/2002 | Shin et al. ................. 438/319 |
| 2001/0028093 | A1 | 10/2001 | Yamazaki et al. |
| 2004/0188797 | A1 | 9/2004 | Khater et al. |
| 2004/0224461 | A1 | 11/2004 | Dunn et al. |
| 2004/0262715 | A1 * | 12/2004 | Miura et al. ................. 257/565 |

FOREIGN PATENT DOCUMENTS

| EP | 0818829 A | 1/1998 |
| EP | 1096557 A | 5/2001 |
| FR | 2805924 A | 9/2001 |

OTHER PUBLICATIONS

Kyoung Hwan Yeo et al; "A Partially Insulated Field-Effect Transistor (PIFET) As a Candidate for Scaled Transistors". IEEE Electron Device Letters, IEEE, Piscataway, NJ, USA. vol. 25, No. 6, Jun. 2004, pp. 387-389.

(Continued)

*Primary Examiner*—Chandra Chaudhari

(57) ABSTRACT

The invention relates to a method of manufacturing a bipolar transistor on a semiconductor substrate (11) which is provided with a first, a second and a third layer (1,2,3) of a first, second and third semiconductor material respectively, all of a first conductivity type. A first portion of the second layer (2) is transformed into a buried isolation region (15) comprising a first electrically insulating material. A first semiconductor region (6) of the first conductivity type, comprising, for example, a collector region, is formed from a second portion of the second layer (2) adjoining the buried isolation region (15) and a portion of the first layer (1) adjoining the second portion of the second layer (2). Then a base region (7) is formed on the buried isolation region (15) and on the first semiconductor region (6) by transforming the third layer (3) into a second conductivity type, which is opposite to the first conductivity type. Thereafter a second semiconductor region (8) of the first conductivity type, comprising, for example, an emitter region, is formed on a part of the base region (7). This method provides for the formation of a bipolar transistor with an advantageous decrease of the extrinsic collector to base region (6,7) capacitance by the fact that the value of this capacitance is mainly determined by the buried isolation region (15) which has a substantially lower dielectric constant than that of the collector to base region (6,7) junction.

9 Claims, 4 Drawing Sheets

OTHER PUBLICATIONS

Figure 1:
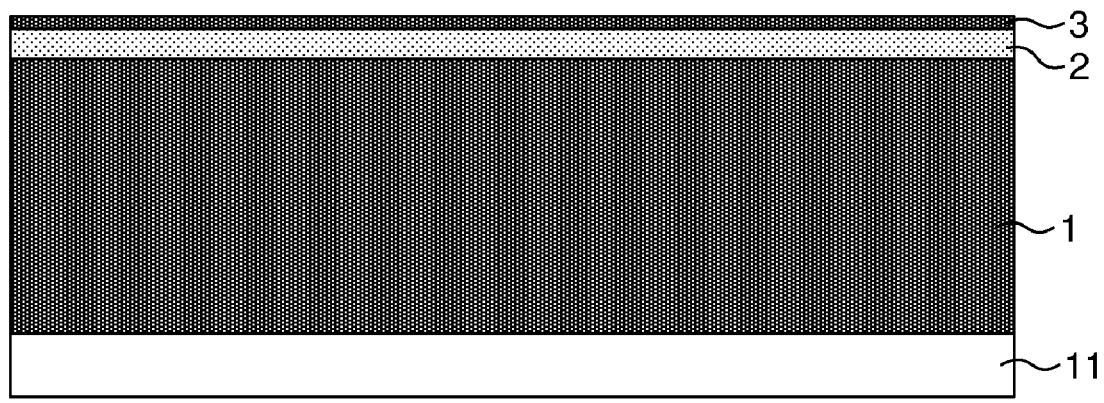

Yongsik Jeong et al; "FMAX Enhancement in INP-Based DHBTS Using a New Lateral Reverse-Etching Technique". 2003 International Conference Indium Phosphide and Related Materials. Conference Proceedings. (IPRM). Santa Barbara, CA, May 12-16, 2003, International Conference on Indium Phosphide and Related Materials, New York, NY. IEEE, US, May 12, 2003. pp. 22-25.

* cited by examiner

METHOD OF MANUFACTURING A BIPOLAR TRANSISTOR

The invention relates to a method of manufacturing a bipolar transistor.

Semiconductor technologies have seen a tremendous increase in the cutoff frequency and maximum frequency of oscillation over the past decade. These figures of merit have increased from tens of GHz to hundreds of GHz. This development has been achieved predominantly as a result of an increased current drive of the applied bipolar transistors.

There is a fundamental tradeoff between the maximum current drive and the collector to base capacitance of a bipolar transistor. To achieve a high cutoff frequency and the high current drive, a high doping level in the collector region is required, which disadvantageously increases the collector to base capacitance considerably. The collector to base capacitance introduces a disadvantageous parasitic feedback in the device that limits the gain of the bipolar transistor. Therefore, the collector to base capacitance should be as low as possible, of course without affecting current drive and cutoff frequency.

An npn-type bipolar transistor with a high cutoff frequency is disclosed in US2004/0224461 in which the bipolar transistor comprises a mesa-shaped emitter region on top of a layered base region, and a collector region there under. The junction between the base region and the collector region is surrounded by an electrically insulating region which is buried under the base region and which forms a local constriction of the semiconductor body.

The bipolar transistor comprises intrinsic and extrinsic regions. The intrinsic regions of the bipolar transistor are the regions that are required for the (intrinsic) operation of the bipolar transistor. The extrinsic regions are not required for the (intrinsic) operation of the bipolar transistor, but these extrinsic regions are present because the bipolar transistor in practice requires some measures to be able to operate, such as, for example, electrical connections to the base and collector regions, which electrical connections normally cannot be made directly on the intrinsic region of the base and collector regions. A drawback of the known bipolar transistor is that it comprises a collector to base capacitance with an extrinsic region that disadvantageously decreases the high frequency performance of the known bipolar transistor.

It is an object of the present invention to provide a method of fabricating a bipolar transistor in which the capacitance, introduced by the extrinsic region, is reduced. The invention provides a method as claimed in claim 1. Advantageous embodiments are defined by the dependent claims.

The method of manufacturing a bipolar transistor according to the invention on a semiconductor substrate comprises the steps of:
forming on the semiconductor substrate a first, a second and a third layer of a first, second and third semiconductor material respectively, all of a first conductivity type;
transforming a first portion of the second layer into a buried isolation region comprising a first electrically insulating material;
forming a first semiconductor region of the first conductivity type, comprising a collector region or an emitter region, from a second portion of the second layer adjoining the buried isolation region and a portion of the first layer adjoining the second portion of the second layer;
forming a base region on the buried isolation region and on the first semiconductor region by transforming the third layer into a layer of a second conductivity type, which is opposite to the first conductivity type; and
forming a second semiconductor region of the first conductivity type, comprising the other of said collector region and said emitter region, on a part of the base region.

The invention provides for a fabrication method of a bipolar transistor in which the extrinsic capacitance between the first semiconductor region and the base region is decreased, because of the buried insulating layer in the first semiconductor region on which layer and region the base region is formed. The extrinsic first semiconductor region to base region capacitance is decreased by the fact that the value of this capacitance is now partly determined by the buried insulating layer, which has a substantially lower dielectric constant than that of the first semiconductor region to base region junction. For example, a capacitance is achieved that is lowered by a factor of two or more depending, amongst others, on the thickness of the buried isolation region. Furthermore, the value of the first semiconductor region to base region capacitance is less dependant on the doping levels of the first semiconductor region and the base region, which enables an increase of the doping levels of one or both of these regions to improve the performance of the bipolar transistor without increasing the extrinsic capacitance formed by the first semiconductor region to base region. Another advantage is that the buried isolation region is a diffusion barrier for dopants in the extrinsic part of the base region, which enables a higher doping level for the extrinsic base region without resulting in a too deep first semiconductor region to base region junction. Yet another advantage is that the injection of charge carriers from the base region into the first semiconductor region, and vice versa, is suppressed in the area where the buried isolation region is inserted. This ultimately leads to a further improved high-frequency performance of the bipolar transistor.

It is noted in this connection that when the emitter region and the collector region exchange roles in a conventional bipolar transistor, the transistor is called an inverted transistor. In the device according to the invention, too, the emitter region may be positioned under the base region in a corresponding manner.

A method to fabricate a buried insulating layer in a Field Effect Transistor (FET) device is known as such from the publication entitled "A Partially Insulated Field-Effect Transistor (PiFET) as a Candidate for Scaled Transistors" by Kyoung Hwan Yeo et al. that has been published in IEEE Electron Device Letters, vol. 25 no. 6, June 2004. In this publication a SiGe layer is deposited epitaxially on a semiconductor substrate and on said layer a silicon layer is deposited. A mask is provided on the silicon layer, which is provided with an opening. In the opening both the silicon layer and the SiGe layer are removed by etching. Subsequently, after removal of the mask, a further silicon layer is provided in the etched opening in the silicon and SiGe layer. In this way, a SiGe region buried by a silicon layer is obtained. The SiGe region is then removed by selective etching and replaced by an insulating material, e.g. a silicon dioxide. A FET is then formed above two of such regions in which the SiGe has been replaced by silicon dioxide and which are separated by a silicon region. In this way a partially insulated FET is obtained. This known method provides for a buried isolation region in a FET device, whereas the method according to the invention provides a bipolar transistor by combining the formation of the buried isolation region with the formation of the first semiconductor region, comprising for example the collector region, and the transformation of the conductivity type of the third layer into the opposite conductivity type, thereby forming the base region of the bipolar transistor.

In a favorable embodiment of the method according to the invention, the step of transforming the first portion of the second layer into the buried isolation region is characterized by the steps of:

provide an opening which exposes a part of the second layer;

removing a portion of the second layer selectively with respect to the first and the third layer, thereby forming a cavity between the first and the third layer; and filling the cavity with the first electrically insulating material, thereby forming the buried isolation region.

This method is a simple and robust way to manufacture the buried insulation region and may be integrated in a standard process flow, such as, for example, a CMOS (Complementary Metal Oxide Semiconductor) technology where the opening, for example, may be provided by a standard STI (Shallow Trench Isolation) region.

In a preferred embodiment of a method according to the invention, the second semiconductor material comprises a mixed crystal of silicon and germanium, and the first and the third semiconductor material both comprise silicon. This advantageously enables the selective removal of a part of the second layer with respect to the first and third layer. In a further advantageous embodiment the step of forming the first semiconductor region comprises a thermal step after which most of the germanium is diffused out of the second layer. Because the first and the third layer comprise silicon, the thermal oxidation step enables the germanium comprised in the second layer to diffuse to the first and the third layer. Thereafter, the germanium is not concentrated in the second layer anymore, but spread out in the first, second and third layer in such a way that the influence of the silicon germanium on the performance of the bipolar transistor is reduced to an acceptable level.

In a favorable embodiment according to the invention, the step of forming the base region is characterized by the step of epitaxial growth of a fourth layer of a second conductivity type on the third layer thereby transforming the third layer into the second conductivity type. This advantageously reduces the number of required process steps to obtain the base region.

Preferably the third layer has a thickness in the range of 10 nanometers to 100 nanometers. This facilitates the formation of the base region in the part of the third layer, which is located on top of the buried isolation region.

In a favorable embodiment according to the invention, a photolithographic step is applied before the step of transforming the first portion of the second layer into the buried isolation region, which photolithographic step opens regions where the first portion of the second layer is transformed. This enables the formation of regions where the buried isolation region does not need to be fabricated, for example in a region where a standard CMOS transistor is fabricated.

Preferably the first, second and third layer are formed as part of an epitaxial layer. This advantageously reduces the number of required process steps.

In a favorable embodiment of a method according to the invention, the first semiconductor region comprises the collector region and the second semiconductor region comprises the emitter region.

Figure 2:
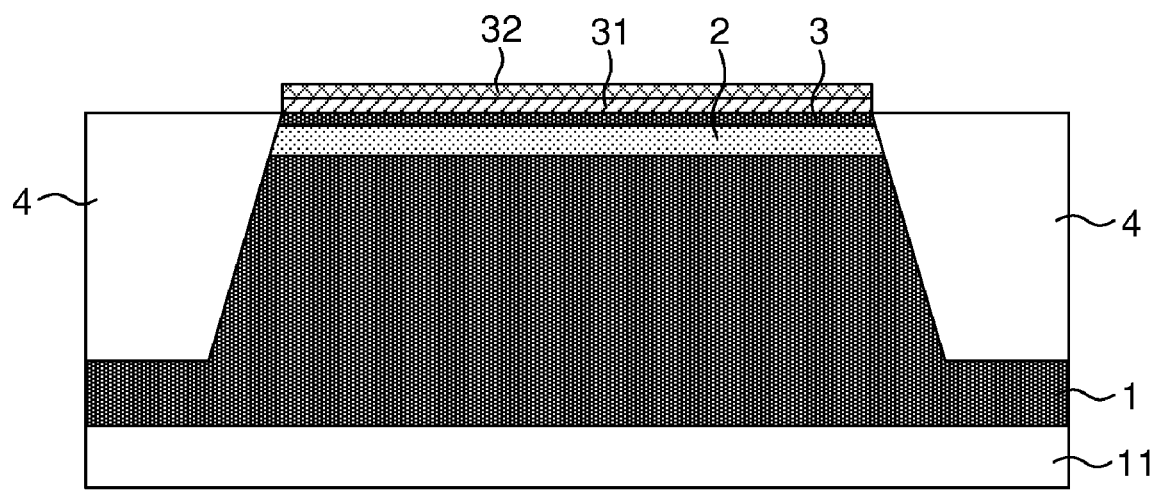
Figure 3:
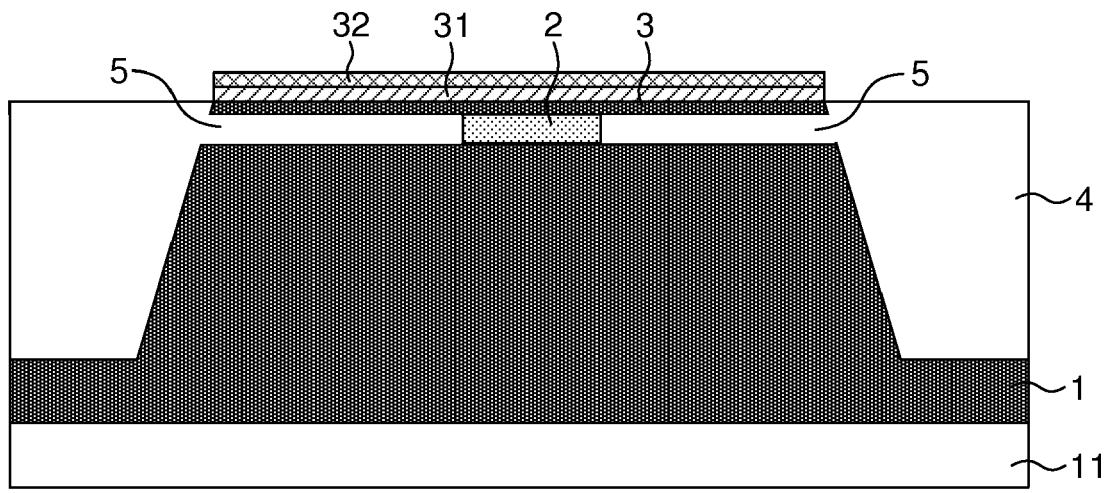
Figure 4:
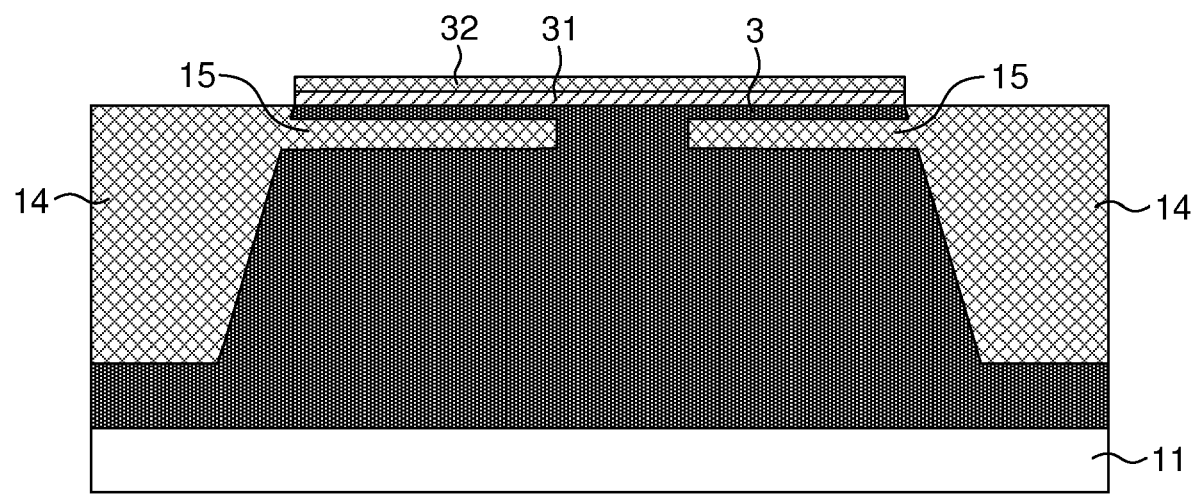
Figure 5:
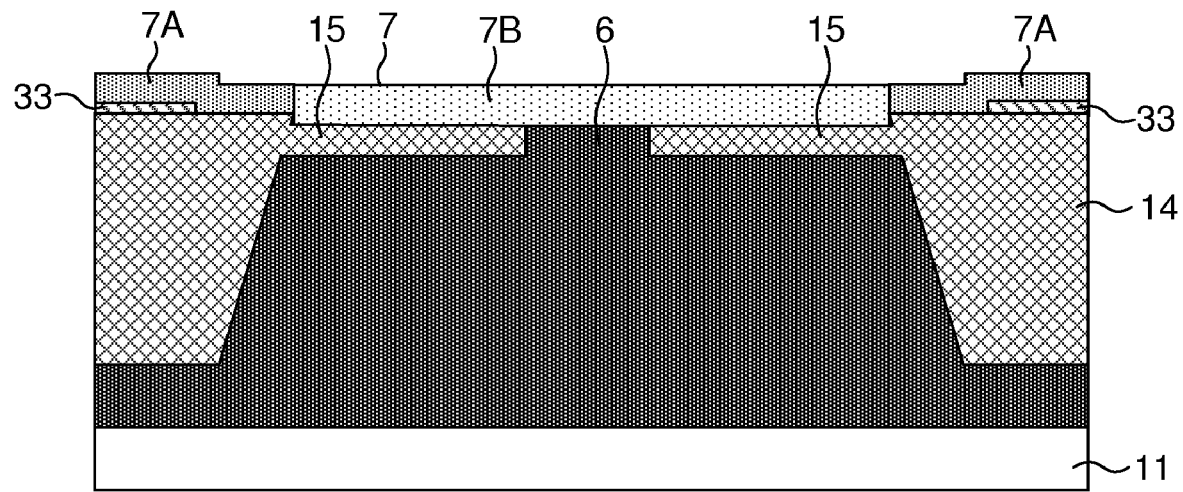
Figure 6:
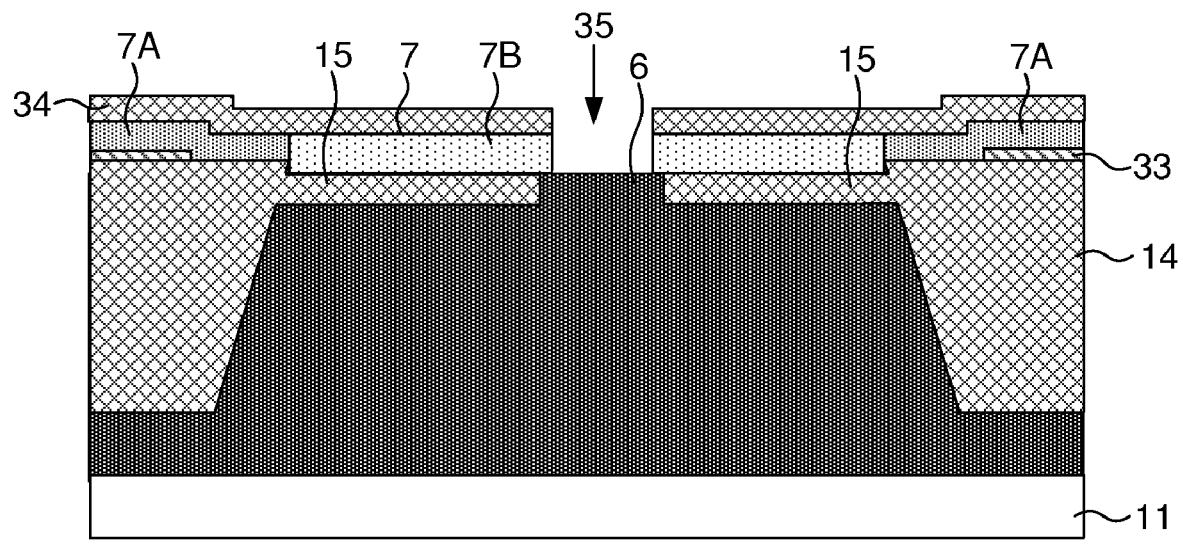
Figure 7:
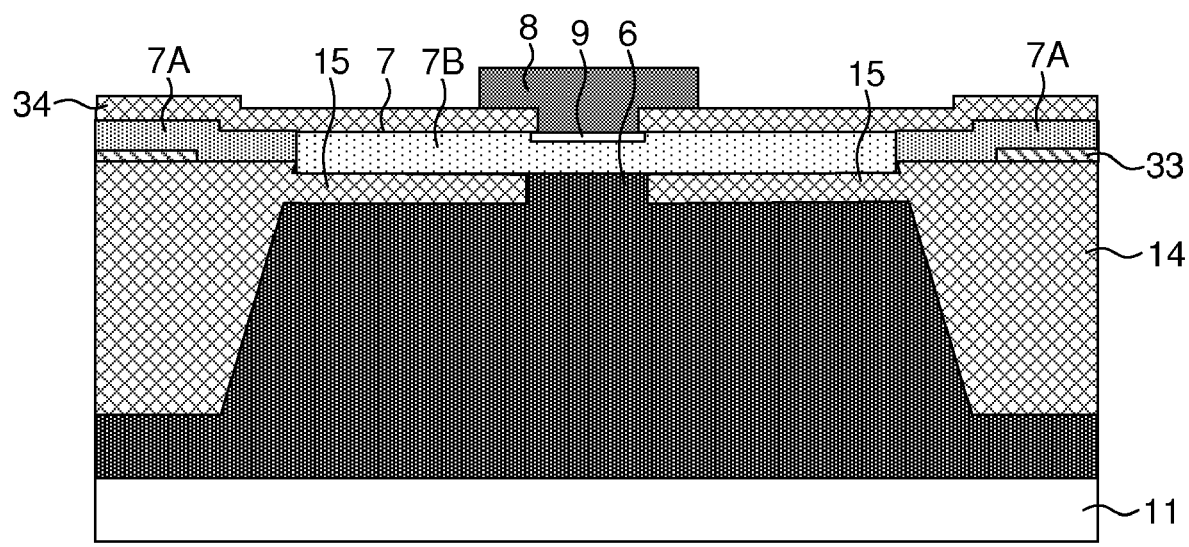
Figure 8:
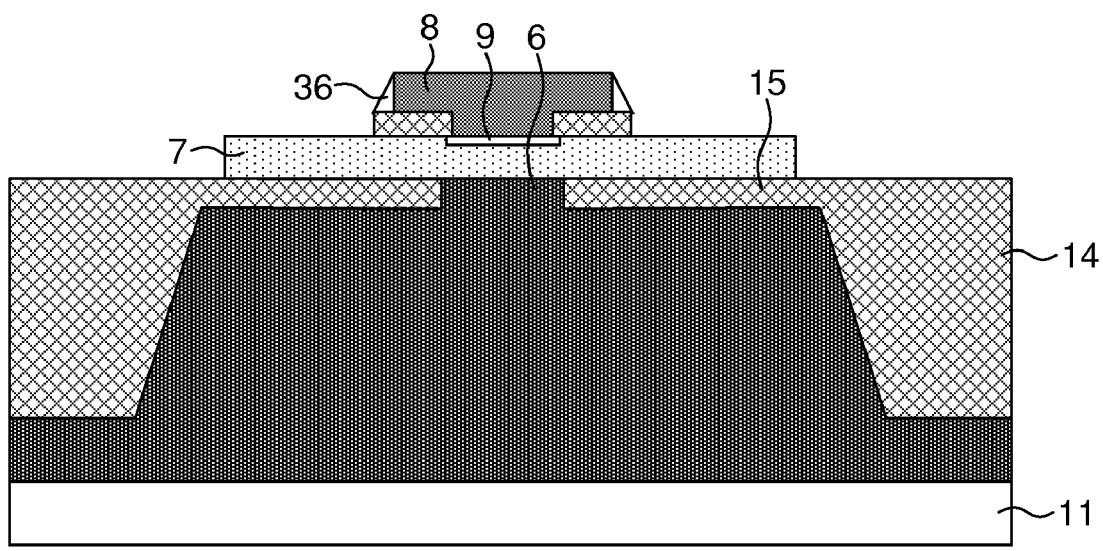

The invention will now be explained in more detail with reference to an embodiment and the drawing, in which:

FIGS. 1-8 are schematic, cross-sectional views perpendicular to the thickness direction of a device, showing successive stages of the manufacture thereof by means of a method according to the invention.

The Figures are not drawn to scale, and some dimensions are exaggerated for the sake of clarity. Like regions or parts are indicated by the same numerals as much as possible.

FIGS. 1-8 are schematic, cross-sectional views perpendicular to the thickness direction of a device, showing successive stages of the manufacture thereof by means of a method according to the invention.

The starting point (see FIG. 1) is an n-type silicon substrate 11, on which a first silicon layer 1, a SiGe layer 2 and a further silicon layer 3 are formed by epitaxy, wherein, in this example, all three layers (1,2,3) are n-type. An underlying part of the substrate 11 has been left out of the drawing for the sake of simplicity. The SiGe layer 2 has, in this example, a Ge content of 20% and a thickness of approximately 20 nm to 30 nm. The thickness of the further silicon layer 3 is preferably in the range of 10 nm to 100 nm to enable, in a further stage of the process, the transformation of this second layer 3 into a base region.

Thereafter (see FIG. 2), a silicon dioxide layer 31 and a silicon nitride layer 32 are deposited and patterned to open up a window where STI (shallow trench isolation) cavities 4 are formed by etching of the further silicon layer 3, the SiGe layer 2 and a portion of the first silicon layer 1. The sidewalls of the STI cavities 4 expose side faces of the second layer 3, the SiGe layer 2 and a part thereof of the first silicon layer 1.

Subsequently (see FIG. 3), part of the SiGe layer 2 is removed from the side walls of the STI cavities 4 by means of a selective—wet or dry—chemical etching process. Buried cavities 5 are thereby formed adjacent to the STI cavities 4 and to the remaining part of the SiGe layer 2. The side of the remaining part of the SiGe layer 2 is, in this example, approximately 100 nm to 200 nm from the sidewall of the STI region 4.

Then (see FIG. 4) a thermal oxidation step is done that fills the buried cavities 5 with silicon dioxide, thereby forming buried isolation regions 15. The thermal oxidation is done at a temperature of about 900° C. to 1050° C. An advantageous result of this thermal oxidation step is that the SiGe layer 2 is transformed into a layer with relatively less Ge than the SiGe layer 2, because a part of the Ge atoms of the SiGe layer 2 are thermally diffused to the surrounding first and further silicon layers 1,3. In this case, the Ge content of the SiGe layer 2 will be reduced to lower than 10% and the Ge-rich SiGe layer 2, which could disadvantageously influence the to be fabricated bipolar transistor, is as such no longer part of the collector region of the to be fabricated bipolar transistor due to the out diffusion of Ge. Hence, the to be fabricated bipolar transistor does not comprise the Ge-rich SiGe layer 2, which, as being part of a to be fabricated collector region, advantageously influences the performance of the to be fabricated bipolar transistor. Then the remaining part of the STI cavities 4 is filled with an isolation material, which is not necessarily the same material with which the buried cavities 5 are filled, such as silicon dioxide, using commonly known techniques, such as, for example, HDP (High Density Plasma) oxide and CMP (Chemical Mechanical Planarization), thereby forming STI regions 14. In an alternative embodiment, an insulation layer is formed on the exposed surfaces of the STI cavities 4, after which the STI cavities 4 are not filled with a solid or liquid material, but instead are filled with a gas, for example air, or are made vacuum, thus creating vacuum STI regions. This advantageously improves the isolation properties of the STI regions.

Thereafter (see FIG. 5), the silicon dioxide layer 31 and the silicon nitride layer 32 are removed using standard etching techniques. A protective seed layer 33 is formed using photolithographic patterning and etching techniques, defining a window where a bipolar transistor will be formed and which at the same protects a region where, for example, standard CMOS devices are formed. By applying epitaxy of silicon, a base layer 7 is formed which has a monocrystalline silicon part 7B formed on silicon regions and a polycrystalline silicon part 7A formed on other regions. The further silicon layer 3 is now transformed in to a part of the monocrystalline part 7B of the base layer 7, and hence the base layer 7 adjoins the buried isolation region 15. At this point a collector region 6 is defined which comprises the remaining parts of the first silicon layer 1 and the SiGe layer 2 that are in between the buried isolation regions 15 and the STI cavities 4.

Now (see FIG. 6) an insulation layer 34 is formed, for example by deposition of silicon dioxide, and an emitter opening 35 is formed by photolithographic patterning and etching techniques.

Following this (see FIG. 7) the emitter opening 35 is filled with an, in this case, n-type polycrystalline silicon layer thereby forming an emitter connection region 8. Said layer is formed by means of a CVD process. By subjecting the resulting structure to a heat treatment, an emitter region 9 is formed in a part of the base layer 7 by local over doping as a result of out diffusion of the n-type contaminations from the emitter connection region 8 into the base layer 7. Then the emitter connection region 8 is patterned by photolithography and etching, obtaining a T-shaped cross-section for the emitter connection region 8.

Subsequently (see FIG. 8), the base layer 7 is patterned and etched, and emitter spacers 36 are formed. Thereafter, connecting conductors are formed that electrically connect to the bipolar transistor regions (not shown in the Figures).

In summary, the invention provides a method of manufacturing a bipolar transistor on a semiconductor substrate which is provided with a first, a second and a third layer of a first, second and third semiconductor material respectively, all of a first conductivity type. A first portion of the second layer is transformed into a buried isolation region comprising a first electrically insulating material. A first semiconductor region of the first conductivity type, comprising, for example, a collector region, is formed from a second portion of the second layer adjoining the buried isolation region and a portion of the first layer adjoining the second portion of the second layer. Then a base region is formed on the buried isolation region and on the first semiconductor region by transforming the third layer into a second conductivity type, which is opposite to the first conductivity type. Thereafter a second semiconductor region of the first conductivity type, comprising, for example, an emitter region, is formed on a part of the base region. This method provides for the formation of a bipolar transistor, with an advantageous decrease of the extrinsic collector to base region capacitance by the fact that the value of this capacitance is mainly determined by the buried isolation region which has a substantially lower dielectric constant than that of the collector to base region junction.

The invention is not limited to the embodiments as discussed herein, as many variations and modifications are possible to those skilled in the art within the scope of the invention. Thus, in addition to being suitable for use in a discrete semiconductor device, the invention is also very suitable for use in an integrated semiconductor device, such as a (BI) CMOS (=(Bipolar) Complementary Metal Oxide Semiconductor) IC (=Integrated Circuit). The method according to the invention can also be advantageously combined with the formation of PiFETs (Partly Insulated Field Effect Transistors). In fact, the structure and the manufacture of the transistor as described in the examples is quite suitable for use in an IC.

Furthermore it is noted that besides SiGe, it is also possible to use other materials which can be selectively etched and on which silicon monocrystalline can be grown. An example of such a material is SiC. In addition to that, silicon may also be provided with contaminations which hardly affect the grid constant of silicon but which nevertheless enable selective etching. Thus, n-type silicon can be selectively etched with respect to p-type silicon, for example, or vice versa. Furthermore, an electrically non-active do pant may influence the etchability of silicon to a sufficient extent.

Many variants and modifications are possible also with regard to a method according to the invention. Thus, the SiGe layer or a SiGe region can also be formed by implanting germanium in a silicon region.

In the claims, any reference signs between parentheses shall not be construed as limiting the scope. The indefinite article "a" or "an" does not exclude the presence of a plurality. Features recited in mutually different dependent claims may be combined.

The invention claimed is:

1. A method of manufacturing a bipolar transistor on a semiconductor substrate comprising the steps of:
   forming on the semiconductor substrate a first, a second and a third layer a first, second and third semiconductor material respectively, all of a first conductivity type;
   transforming a first portion of the second layer into a buried isolation region comprising a first electrically insulating material;
   forming a first semiconductor region of the first conductivity type, comprising a collector region or an emitter region, from a second portion of the second layer adjoining the buried isolation region and a portion of the first layer adjoining the second portion of the second layer;
   forming a base region on the buried isolation region and on the first semiconductor region by transforming the third layer into a layer of a second conductivity type, which is opposite to the first conductivity type; and
   forming a second semiconductor region of the first conductivity type, comprising the other of said collector region and said emitter region, on a part of the base region.

2. A method as claimed in claim 1, wherein the step of transforming the first portion of the second layer into the buried isolation region is characterized by the steps of:
   providing an opening which exposes a part of the second layer;
   removing a portion of the second layer selectively with respect to the first and the third layer thereby forming a cavity between the first and the third layer; and
   filling the cavity with the first electrically insulating material, thereby forming the buried isolation region.

3. A method as claimed in claim 1, characterized in that the second semiconductor material comprises a mixed crystal of silicon and germanium, and the first and the third semiconductor material both comprise silicon.

4. A method of manufacturing a bipolar transistor on a semiconductor substrate comprising the steps of:
   forming on the semiconductor substrate a first, a second and a third layer a first, second and third semiconductor material respectively, all of a first conductivity type;
   transforming a first portion of the second layer into a buried isolation region comprising a first electrically insulating material;
   forming a first semiconductor region of the first conductivity type, comprising a collector region or an emitter region, from a second portion of the second layer adjoining the buried isolation region and a portion of the first layer adjoining the second portion of the second layer;

forming a base region on the buried isolation region and on the first semiconductor region by transforming the third layer into a layer of a second conductivity type, which is opposite to the first conductivity type; and forming a second semiconductor region of the first conductivity type, comprising the other of said collector region and said emitter region, on a part of the base region, wherein the second semiconductor material comprises a mixed crystal of silicon and germanium, and the first and the third semiconductor material both comprise silicon, and the step of forming the first semiconductor region comprises a thermal step after which most of the germanium is diffused out of the second layer.

5. A method as claimed in claim 1, wherein the step of forming the base region is characterized by the step of epitaxial growth of a fourth layer of a second conductivity type on the third layer thereby transforming the third layer into the second conductivity type.

6. A method as claimed in claim 1, characterized in that the third layer has a thickness in the range of 10 nanometers to 100 nanometers.

7. A method as claimed in claim 1, characterized in that, before the step of transforming the first portion of the second layer into the buried isolation region, a photolithographic step is applied which opens regions where the first portion of the second layer is transformed.

8. A method as claimed in claim 1, characterized in that the first, second and third layer are formed as part of an epitaxial layer.

9. A method as claimed in claim 1, characterized in that the first semiconductor region comprises the collector region and the second semiconductor region comprises the emitter region.

* * * * *